US007816683B2

(12) United States Patent
Lee et al.

(10) Patent No.: US 7,816,683 B2

(45) Date of Patent: Oct. 19, 2010

(54) ARRAY SUBSTRATE AND DISPLAY APPARATUS HAVING THE SAME

(75) Inventors: Bong-Jun Lee, Seoul (KR); Myung-Koo Hur, Cheonan-si (KR); Sung-Man Kim, Seoul (KR); Hong-Woo Lee, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 437 days.

(21) Appl. No.: 11/839,125

(22) Filed: Aug. 15, 2007

(65) Prior Publication Data

US 2008/0067512 A1 Mar. 20, 2008

(30) Foreign Application Priority Data

Sep. 18, 2006 (KR) ..................... 10-2006-0090247

(51) Int. Cl.
*H01L 31/00* (2006.01)
*G09G 3/36* (2006.01)
*G02F 1/135* (2006.01)

(52) U.S. Cl. ............................. 257/59; 345/87; 349/48

(58) Field of Classification Search ................... 257/59, 257/72, E27.108; 345/87–100; 349/38, 42–43, 349/48; 438/30

See application file for complete search history.

(56) References Cited

U.S. PATENT DOCUMENTS

| | | | | |
|---|---|---|---|---|
| 5,151,689 | A | 9/1992 | Kabuto et al. | |
| 5,751,261 | A | 5/1998 | Zavracky et al. | |
| 6,022,753 | A * | 2/2000 | Park et al. | 438/30 |
| 6,362,798 | B1 * | 3/2002 | Kimura et al. | 345/55 |
| 6,646,691 | B1 | 11/2003 | Watanabe et al. | |
| 6,670,943 | B1 * | 12/2003 | Ishii et al. | 345/100 |
| 6,774,956 | B2 * | 8/2004 | Ono et al. | 349/39 |
| 2001/0019372 | A1 * | 9/2001 | Ootsu et al. | 349/38 |
| 2001/0033336 | A1 * | 10/2001 | Kameshima et al. | 348/300 |
| 2002/0145695 | A1 * | 10/2002 | Kim et al. | 349/141 |
| 2003/0011694 | A1 * | 1/2003 | Dierickx | 348/308 |
| 2003/0043098 | A1 | 3/2003 | Aoyama et al. | |
| 2004/0160403 | A1 | 8/2004 | Tsai | |

(Continued)

FOREIGN PATENT DOCUMENTS

| | | |
|---|---|---|
| CN | 1407527 | 4/2003 |

(Continued)

OTHER PUBLICATIONS

Extended Search Report issued Sep. 10, 2009 by the European Patent Office for European Application No. 07017273.9.

*Primary Examiner*—Lynne A Gurley
*Assistant Examiner*—Galina Yushina
(74) *Attorney, Agent, or Firm*—H.C. Park & Associates, PLC

(57) ABSTRACT

In an array substrate and a display apparatus, a gate line receives a gate pulse during a present 1H period and a data line receives a pixel voltage having a polarity inverted at every frame. When a thin film transistor is turned on in response to the gate pulse during the present 1H period, a pixel electrode receives the pixel voltage through the thin film transistor during the present 1H period. A pre-charging part pre-charges the pixel electrode to a common voltage that is a reference voltage of the pixel voltage in response to a previous gate pulse during a previous 1H period.

19 Claims, 12 Drawing Sheets

U.S. PATENT DOCUMENTS

| | | | | |
|---|---|---|---|---|
| 2004/0196232 | A1* | 10/2004 | Kim et al. | 345/89 |
| 2004/0263453 | A1* | 12/2004 | Yun et al. | 345/87 |
| 2005/0112813 | A1* | 5/2005 | Kim et al. | 438/197 |
| 2005/0243044 | A1* | 11/2005 | Kang et al. | 345/87 |
| 2006/0007215 | A1* | 1/2006 | Tobita et al. | 345/204 |
| 2006/0092342 | A1* | 5/2006 | Lee | 349/38 |
| 2006/0138418 | A1* | 6/2006 | Lee et al. | 257/59 |

FOREIGN PATENT DOCUMENTS

| | | | |
|---|---|---|---|
| CN | 1545691 | | 11/2004 |
| EP | 1174849 | | 9/2002 |
| EP | 1251483 | | 4/2003 |
| EP | 1492078 | | 5/2006 |
| JP | 2000227784 | | 8/2000 |
| JP | EP 1136873 | * | 9/2001 |
| JP | 2003-255371 | | 10/2003 |

* cited by examiner

ARRAY SUBSTRATE AND DISPLAY APPARATUS HAVING THE SAME

CROSS-REFERENCE TO RELATED APPLICATION

This application claims priority from and the benefit of Korean Patent Application No. 10-2006-0090247, filed on Sep. 18, 2006, which is hereby incorporated by reference for all purposes as if fully set forth herein.

BACKGROUND OF THE INVENTION

1. Field of the Invention

The present invention relates to an array substrate and a display apparatus including the array substrate. More particularly, the present invention relates to an array substrate that may improve response speed and a display apparatus including the array substrate.

2. Discussion of the Background

In general, a liquid crystal display includes a liquid crystal display panel including a lower substrate, an upper substrate facing the lower substrate, and a liquid crystal layer interposed between the lower substrate and the upper substrate to display an image.

The liquid crystal display panel may include a plurality of gate lines, a plurality of data lines, and a plurality of pixels connected to the gate lines and the data lines, all of which are formed on the liquid crystal display panel. The liquid crystal display panel includes a gate driving circuit directly formed thereon through a thin film process. The gate driving circuit sequentially outputs a gate signal to the gate lines.

Generally, a gate driving circuit includes a shift register in which plural stages are connected to each other one after another. That is, each stage applies a gate signal to a corresponding gate line and controls the drive of a next stage.

However, the number of the gate lines increases as the liquid crystal display panel becomes larger in size and higher in resolution. When the number of gate lines increases, an active period (one horizontal scanning period, 1H period) during which pixels connected to one row are operated is shortened. As a result, the charge rate of the liquid crystal may decrease, thereby decreasing the response speed of a display apparatus.

SUMMARY OF THE INVENTION

The present invention provides an array substrate that may improve response speed and display quality.

The present invention also provides a display apparatus including the above array substrate.

Additional features of the invention will be set forth in the description which follows, and in part will be apparent from the description, or may be learned by practice of the invention.

The present invention discloses an array substrate including a base substrate and a plurality of pixels arranged on the base substrate. Each pixel includes a gate line, a data line, a thin film transistor, a pixel electrode, and a pre-charging part. The gate line receives a gate pulse during a present 1H period (one horizontal scanning period), and the data line receives a pixel voltage having a polarity inverted at every frame. The data line is insulated from the gate line and crosses the gate line. The thin film transistor is connected to the gate line and the data line to output the pixel voltage in response to the gate pulse during the present 1H period. The pixel electrode is connected to the thin film transistor to receive the pixel voltage during the present 1H period. The pre-charging part pre-charges the pixel electrode to a common voltage that is a reference voltage of the pixel voltage in response to a previous gate pulse during a previous 1H period.

The present invention also discloses a display apparatus including an array substrate, an opposite substrate, a gate driving circuit, and a data driving circuit. The array substrate includes a base substrate and a plurality of pixels arranged on the base substrate, and an opposite substrate coupled to the array substrate and facing the array substrate. The gate driving circuit applies a gate pulse to the pixels and the data driving circuit applies a pixel voltage having a polarity inverted at every frame to the pixels. Each pixel arranged on the array substrate includes a gate line, a data line, a thin film transistor, a pixel electrode, and a pre-charging part. The gate line receives the gate pulse during a present 1H period (one horizontal scanning period), and the data line receives the pixel voltage. The data line is insulated from the gate line and crosses the gate line. The thin film transistor is connected to the gate line and the data line to output the pixel voltage in response to the gate pulse during the present 1H period. The pixel electrode is connected to the thin film transistor to receive the pixel voltage during the present 1H period. The pre-charging part pre-charges the pixel electrode to a common voltage that is a reference voltage of the pixel voltage in response to a previous gate pulse during a previous 1H period.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
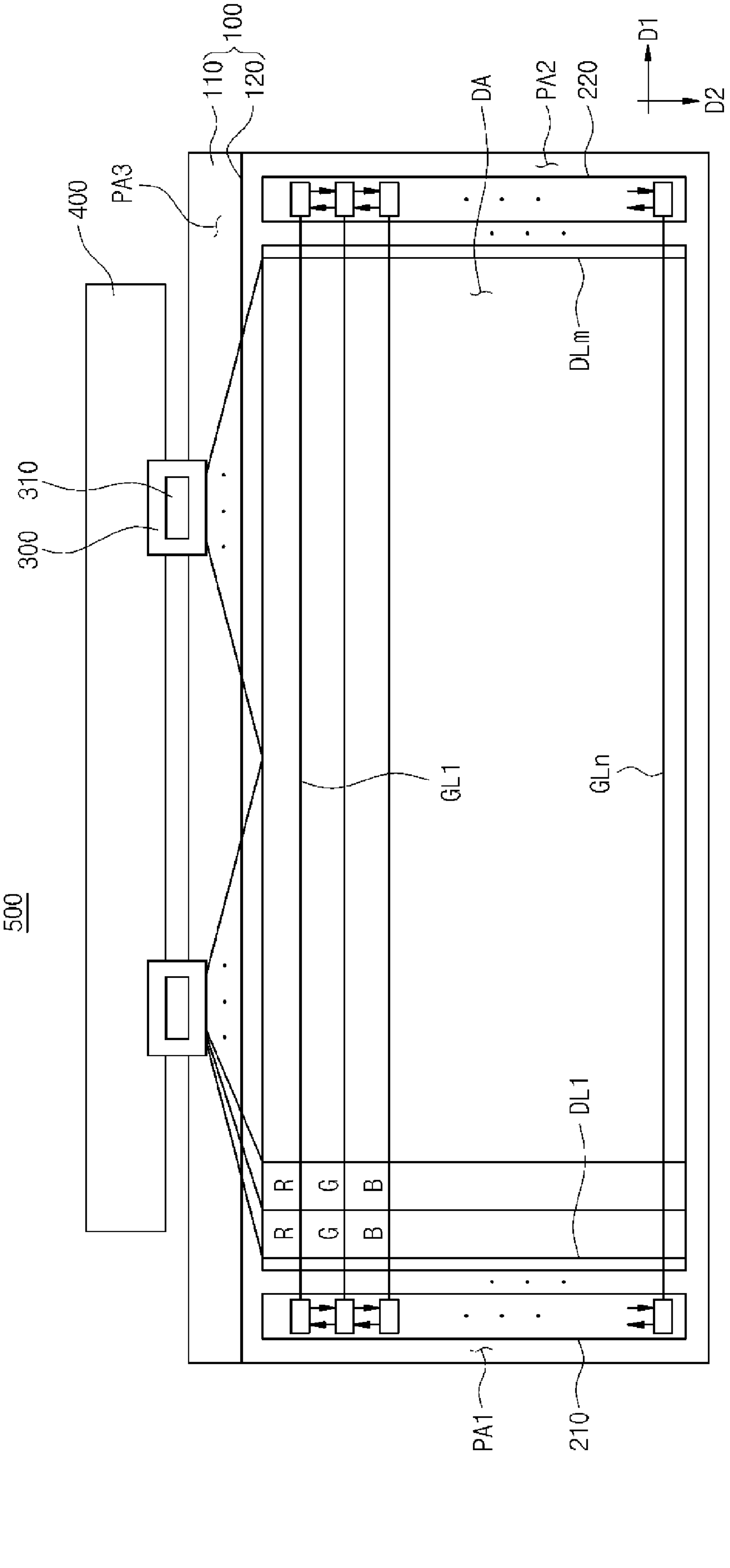
FIG. 1 is a plan view showing a liquid crystal display according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening element or layers may be present. In contrast, when an element is referred to as being "directly on" or "directly connected to" another element or layer, there are no intervening elements or layers present.

FIG. 1 is a plan view showing a liquid crystal display according to an exemplary embodiment of the present invention.

Referring to FIG. 1, a liquid crystal display 500 includes a liquid crystal display panel 100 to display an image, a printed circuit board 400 arranged adjacent to the liquid crystal display panel 100, and a tape carrier package (TCP) 300 connecting the liquid crystal display panel 100 and the printed circuit board 400.

The liquid crystal display panel 100 includes an array substrate 110, a color filter substrate 120 facing the array substrate 110, and a liquid crystal layer (not shown) interposed between the array substrate 110 and the color filter substrate 120. The array substrate 110 is divided into a display area DA on which the image is displayed, a first peripheral area PA1, a second peripheral area PA2, and a third peripheral area PA3. The peripheral areas PA1, PA2, and PA3 are adjacent to the display area DA.

In the display area DA of the array substrate 110, a plurality of pixel areas is defined in a matrix configuration. Particularly, in the display area DA, the pixel areas are defined by a plurality of gate lines GL1~GLn (n is an even-number larger than 2) extending in a first direction D1 and a plurality of data lines DL1~DLm extending in a second direction D2 substantially perpendicular to the first direction D1. The color filter substrate 120 includes a plurality of color pixels (e.g. red, green, and blue pixels) corresponding to the pixel areas arranged thereon.

The first peripheral area PA1 is adjacent to the first ends of the gate lines GL1~GLn, and a first gate driving circuit 210 is arranged in the first peripheral area PA1 to sequentially apply a gate pulse to the gate lines GL1~GLn. The first gate driving circuit 210 includes a shift register in which plural stages are connected to each other one after another. Each stage includes an output terminal connected to a corresponding first end of a gate line GL1~GLn. Thus, each stage is sequentially turned on to sequentially apply the gate pulse to a corresponding gate line GL1~GLn.

The second peripheral area PA2 is adjacent to the second end of the gate lines GL1~GLn, and a second gate driving circuit 220 is arranged in the second peripheral area PA2 to sequentially apply the gate pulse to the gate lines GL1~GLn. The second gate driving circuit 220 includes a shift register having a plurality of stages connected to each other one after another. Each stage includes an output terminal connected to a corresponding second end of a gate line GL1~GLn. Thus, each stage is sequentially turned on to sequentially apply the gate pulse to a corresponding gate line GL1~GLn.

Since the first and second ends of each gate line are connected to the first gate driving circuit 210 and the second driving circuit 220, respectively, the gate pulse is input through both ends of the gate lines, which may prevent delay of the gate pulse.

In the present exemplary embodiment, the first driving circuit 210 and the second driving circuit 220 are substantially simultaneously formed on the array substrate 110 through a thin film process. The thin film process may be the same as that applied to form the pixels. Accordingly, the first gate driving circuit 210 and the second driving circuit 220 are integrated on the array substrate 110, so that the driving chips on which the first gate driving circuit 210 and the second gate driving circuit 220 are mounted may be removed from the liquid crystal display 500. As a result, the productivity of the liquid crystal display 500 may be improved and the size of the liquid crystal display 500 may be decreased.

The third peripheral area PA3 is adjacent to one end of the data lines DL1~DLm, and a first end of the TCP 300 is attached to the third peripheral area PA3. A second end of the TCP 300 is attached to the printed circuit board 400. A data driving chip 310 that provides a pixel voltage to the data lines DL1~DLm is mounted on the TCP 300. Thus, the data driving chip 310 may provide the pixel voltage to the data lines DL1~DLm in response to various control signals from the printed circuit board 400.

First and second gate control signals output from the printed circuit board 400 are provided to the first gate driving circuit 210 and the second gate driving circuit 220 through the TCP 300, respectively. Thus, the first gate driving circuit 210 and the second gate driving circuit 220 provide the gate pulse to the gate lines GL1~GLn in response to the first gate control signal and the second gate control signal, respectively.

As shown in FIG. 1, the pixels arranged on the array substrate 110 have a horizontal pixel structure in which the length in the first direction D1 is longer than a length in the second direction D2. In the horizontal pixel structure, three consecutive pixels arranged along the second direction D2 corresponding to red R, green G, and blue B pixels are defined as one pixel in which one color is displayed. When compared to a vertical pixel structure, the number of data lines is decreased and the number of gate lines is increased in the horizontal pixel structure.

In a liquid crystal display 500 that employs the horizontal pixel structure, the number of data driving chips 310 outputting a data signal decreases due to the decreased number of data lines, which may improve the productivity of the liquid crystal display 500. On the other hand, although the number of gate lines increases, since the first gate driving circuit 210 and the second gate driving circuit 220 are integrated onto the array substrate 110 through a thin film process, the number of chips in the liquid crystal display 500 may not increase.

Hereinafter, the horizontal pixel structure will be described in detail with reference to FIG. 2, FIG. 3, FIG. 4, and FIG. 5.

Figure 2:
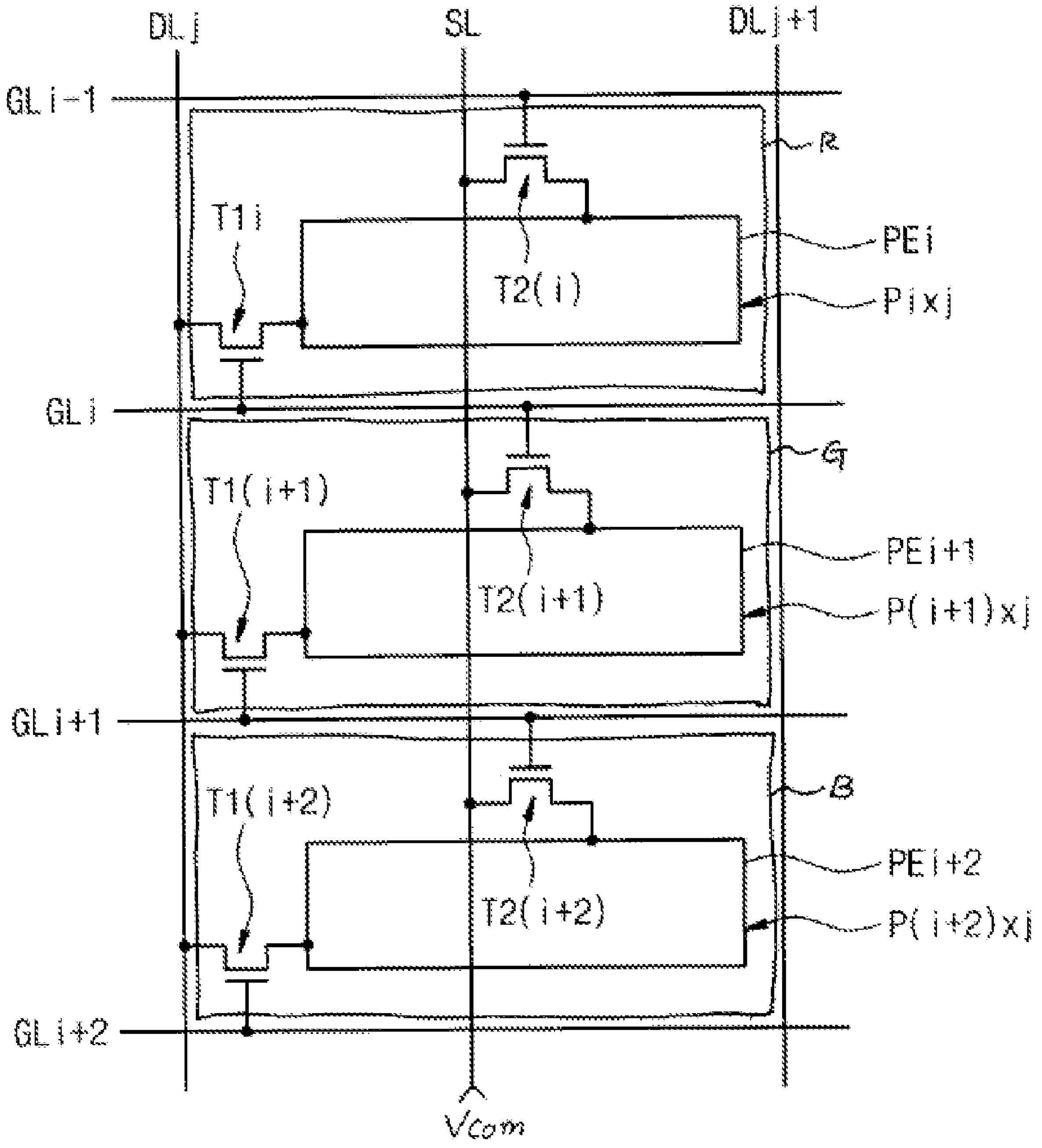
FIG. 2 is a circuit diagram showing one pixel having a horizontal pixel structure shown in FIG. 1.
Figure 3:
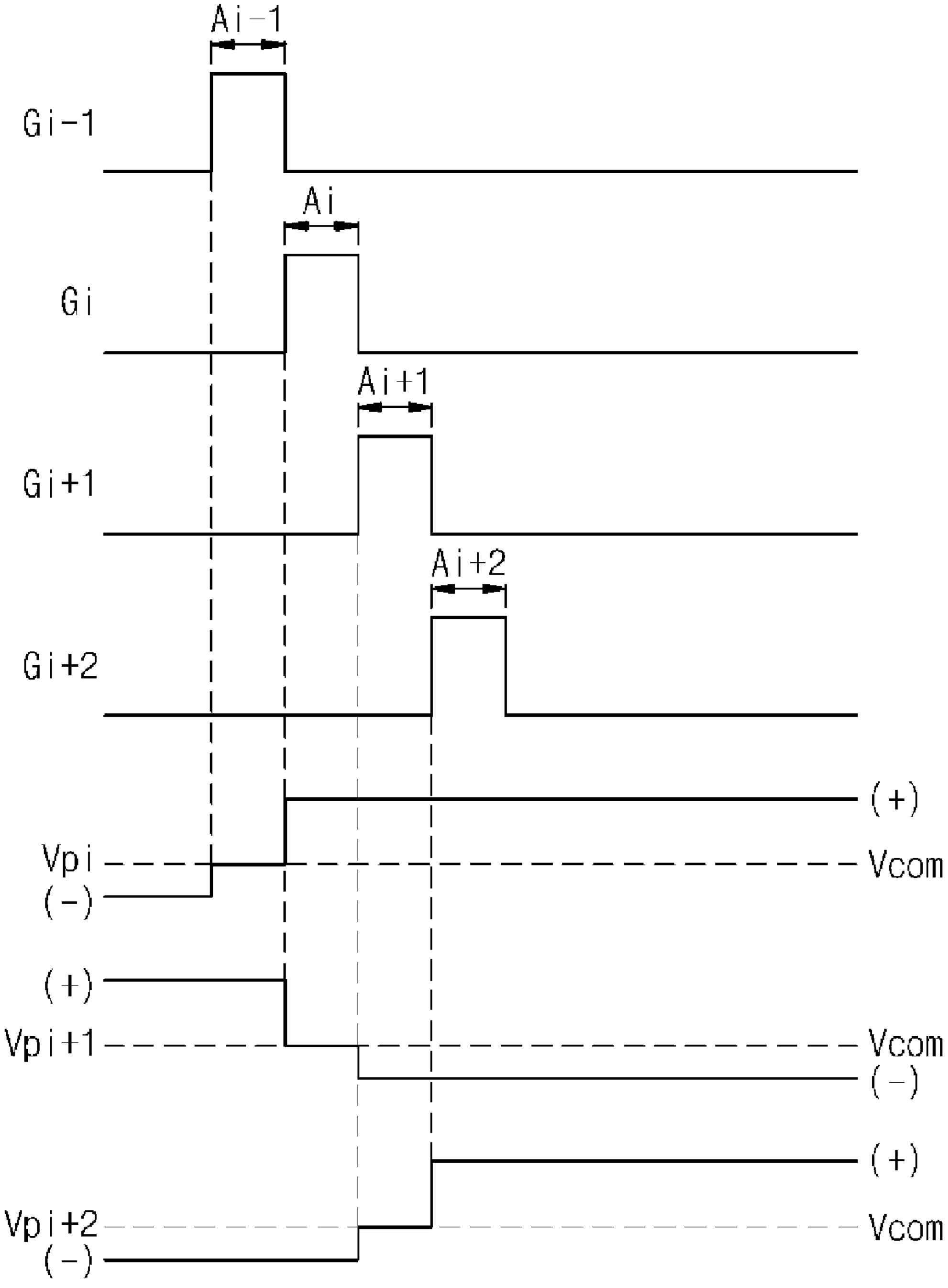
FIG. 3 is a waveform diagram showing a variation of a pixel voltage according to a gate pulse in one pixel of FIG. 2.

FIG. 2 is a circuit diagram showing one pixel having the horizontal pixel structure shown in FIG. 1, and FIG. 3 is a waveform diagram showing a variation of the pixel voltage according to the gate pulse.

Referring to FIG. 2, one pixel includes a first pixel Pixj corresponding to a red pixel R, a second pixel P(i+1)xj corresponding to a green pixel G, and a third pixel P(i+2)xj corresponding to a blue pixel B. Each of the first, second, and third pixels Pixj, P(i+1)xj, and P(i+2)xj has a horizontal pixel structure.

The first pixel Pixj includes an $i^{th}$ gate line GLi, a $j^{th}$ data line DLj, a storage line SL, an $i^{th}$ thin film transistor T1*i*, an $i^{th}$ pre-charging transistor T21, and an $i^{th}$ pixel electrode PEi.

The $i^{th}$ thin film transistor T1*i* is connected to the $i^{th}$ gate line GLi and the $j^{th}$ data line DLj. Particularly, the $i^{th}$ thin film transistor T1*i* includes a gate electrode connected to the $i^{th}$ gate line GLi, a source electrode connected to the $j^{th}$ data line DLj, and a drain electrode connected to the $i^{th}$ pixel electrode PEi.

The $i^{th}$ pre-charging transistor T21 is connected between an $(i-1)^{th}$ gate line GLi−1 and the storage line SL. Particularly, the $i^{th}$ pre-charging transistor T21 includes a gate electrode connected to the $(i-1)^{th}$ gate line GLi−1, a source electrode connected to the storage line SL, and a drain electrode connected to the i-th pixel electrode PEi.

The second pixel P(i+1)xj includes an $(i+1)^{th}$ gate line GLi+1, the $j^{th}$ data line DLj, the storage line SL, an $(i+1)^{th}$ thin film transistor T1(*i*+1), an $(i+1)^{th}$ pre-charging transistor T2(*i*+1), and an $(i+1)^{th}$ pixel electrode PEi+1.

The $(i+1)^{th}$ thin film transistor T1(*i*+1) is connected to the $(i+1)^{th}$ gate line GLi+1, the $j^{th}$ data line DLj and the $(i+1)^{th}$ pixel electrode PEi+1. The $(i+1)^{th}$ pre-charging transistor T2(*i*+1) is connected to the $i^{th}$ gate line GLi, the storage line SL, and the $(i+1)^{th}$ pixel electrode PEi+1.

The third pixel P(i+2)xj includes an $(i+2)^{th}$ gate line GLi+2, the $j^{th}$ data line DLj, the storage line SL, an $(i+2)^{th}$ thin film transistor T1(*i*+2), an $(i+2)^{th}$ pre-charging transistor T2(*i*+2), and an $(i+2)^{th}$ pixel electrode PEi+2.

The $(i+2)^{th}$ thin film transistor T1(*i*+2) is connected to the $(i+2)^{th}$ gate line GLi+2, the $j^{th}$ data line DLj, and the $(i+2)^{th}$ pixel electrode PEi+2. The $(i+2)^{th}$ pre-charging transistor T2(*i*+2) is connected to the $(i+1)^{th}$ gate line GLi+1, the storage line SL, and the $(i+2)^{th}$ pixel electrode PEi+2.

As shown in FIG. 2 and FIG. 3, the first pixel Pixj pre-charges the $i^{th}$ pixel electrode PEi to a common voltage Vcom in response to an $(i-1)^{th}$ gate pulse Gi−1 applied to the $(i-1)^{th}$ gate line GLi−1. Particularly, when the $i^{th}$ pre-charging transistor T2*i* is turned on in response to the $(i-1)^{th}$ gate pulse Gi−1, the common voltage Vcom applied to the storage line SL is applied to the $i^{th}$ pixel electrode PEi through the $i^{th}$ precharging transistor T2*i*. Thus, the $i^{th}$ pixel electrode PEi is pre-charged to the common voltage Vcom during a 1H period (an $(i-1)^{th}$ active period Ai−1) when the $(i-1)^{th}$ gate pulse Gi−1 is generated.

Then, the $i^{th}$ thin film transistor T1*i* is turned on in response to the $i^{th}$ gate pulse Gi, so that an $i^{th}$ pixel voltage Vpi applied to the $j^{th}$ data line DLj is applied to the $i^{th}$ pixel electrode PEi during an $i^{th}$ active period Ai.

When a polarity of the $i^{th}$ pixel voltage Vpi applied to the $i^{th}$ pixel electrode PEi is inverted at every frame, the common voltage Vcom is applied to the $i^{th}$ pixel electrode PEi as a reference voltage during the $(i-1)^{th}$ active period Ai−1. Thus, a time when the $i^{th}$ pixel voltage Vpi reaches to a target voltage may be shortened during the $i^{th}$ active period Ai, so that a response speed of liquid crystal may be improved.

The $(i+1)^{th}$ pixel electrode PEi+1 of the second pixel P(i+1)xj is precharged to the common voltage Vcom in response to the $i^{th}$ gate pulse Gi during the $i^{th}$ active period Ai, and then receives an $(i+1)^{th}$ pixel voltage Vpi+1 in response to the $(i+1)^{th}$ gate pulse Gi+1 during an $(i+1)^{th}$ active period Ai+1.

The $(i+2)^{th}$ pixel electrode PEi+2 of the third pixel P(i+2)xj is pre-charged to the common voltage Vcom in response to the $(i+1)^{th}$ gate pulse Gi+1 during the $(i+1)^{th}$ active period Ai+1, and then receives an $(i+2)^{th}$ pixel voltage Vpi+2 in response to an $(i+2)^{th}$ gate pulse Gi+2 during an $(i+2)^{th}$ active period Ai+2.

As described above, when the polarity of the pixel voltage applied to each pixel is inverted at every frame, present pixels are pre-charged to the common voltage that is a reference voltage of a polarity in response to a previous gate pulse, and then receive a target pixel voltage. Thus, the time required for the pixel voltage of each pixel to reach the target voltage may be shortened during the active period, so that the response speed of the liquid crystal may be improved.

Figure 4:
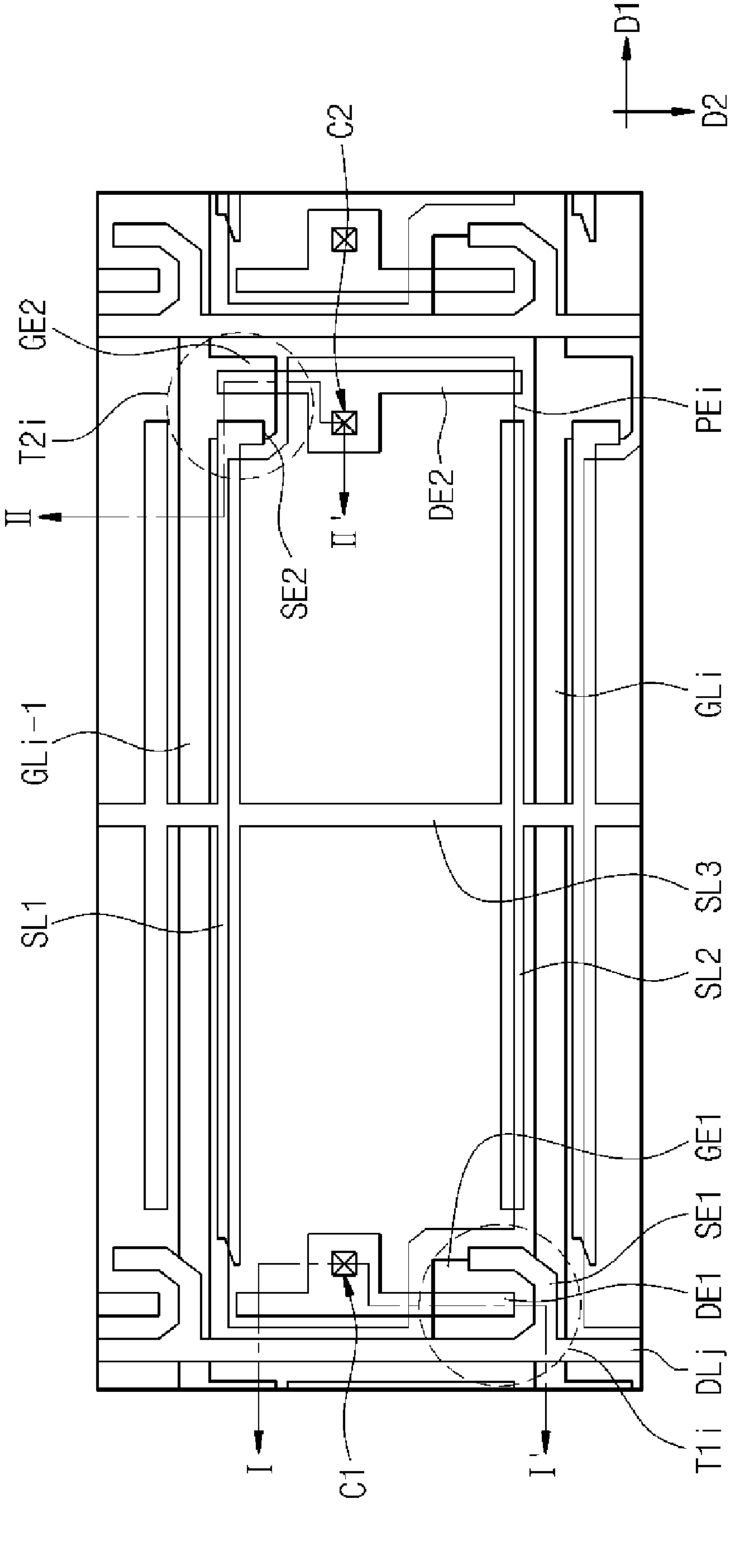
FIG. 4 is a layout showing a pixel on an array substrate shown in FIG. 1.
Figure 5:
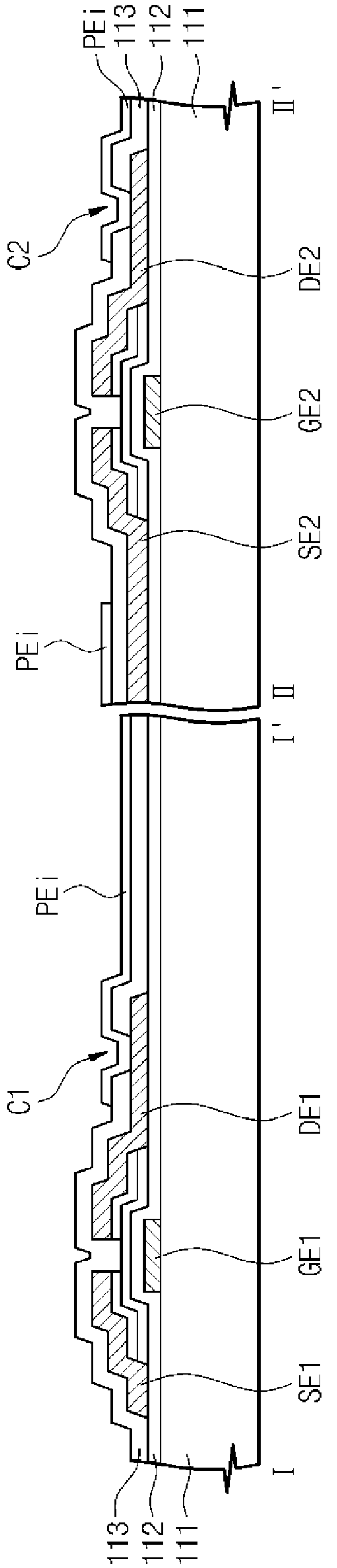
FIG. 5 is a sectional view taken along lines I-I' and II-II' shown in FIG. 4.

FIG. 4 is a layout showing a pixel on the array substrate shown in FIG. 1, and FIG. 5 is a sectional view taken along lines I-I' and II-II' shown in FIG. 4.

The array substrate 110 includes a base substrate 111 and the pixels arranged on the base substrate 111. Since the pixels have a same configuration, only one pixel will be described in detail with reference to FIG. 4 and FIG. 5.

Referring to FIG. 4 and FIG. 5, the $(i-1)^{th}$ gate line GLi−1 and the $i^{th}$ gate line GLi are arranged on the base substrate 111 extending in the first direction D1. In the present embodiment, the $i^{th}$ gate line GLi is defined as a present gate line and the $(i-1)^{th}$ gate line GLi−1 is defined as a previous gate line with reference to the $(ixj)^{th}$ pixel.

The gate electrode GE1 of the $i^{th}$ thin film transistor T1*i* and the gate electrode GE2 of the $i^{th}$ pre-charging transistor T2*i* are formed on the base substrate 111. Particularly, the gate electrode GE1 of the $i^{th}$ thin film transistor T1*i* is branched from the $i^{th}$ gate line GLi, and the gate electrode GE2 of the $i^{th}$ pre-charging transistor T2*i* is branched from the $(-1)^{th}$ gate line GLi−1.

The $(i-1)^{th}$ gate line GLi−1, the $i^{th}$ gate line GLi, the gate electrode GE1 of the $i^{th}$ thin film transistor T1*i*, and the gate electrode GE2 of the $i^{th}$ pre-charging transistor T2*i*, which are arranged on the base substrate 111, are covered by a gate insulating layer 112.

The $j^{th}$ data line DLj extending in the second direction D2, a first storage line SL1, a second storage line SL2, and a third storage line SL3 are arranged on the gate insulating layer 112. The first storage line SL1 and the second storage line SL2 extend in the first direction D1. Particularly, the first storage line SL1 is arranged adjacent to the $(i-1)^{th}$ gate line GLi−1 and the second storage line SL2 is arranged adjacent to the $i^{th}$ gate line GLi. The third storage line SL3 extends in the second direction D2 and connects the first storage line SL1 and the second storage line SL2.

The source electrode SE1 and the drain electrode DE1 of the $i^{th}$ thin film transistor T1*i* and the source electrode SE2 and the drain electrode DE2 of the $i^{th}$ pre-charging transistor T21 are formed on the gate insulating layer 112. The source electrode SE1 of the $i^{th}$ thin film transistor T1*i* is branched from the $j^{th}$ data line DLj, and the drain electrode DEL of the $i^{th}$ thin film transistor T1*i* is spaced apart from the source electrode SE1 by a predetermined distance at an upper portion of the gate electrode GE1. The source electrode SE2 of the $i^{th}$ pre-charging transistor T21 is branched from the first storage line SL1, and the drain electrode DE2 of the $i^{th}$ pre-charging transistor T2*i* is spaced apart from the source electrode SE2 by a predetermined distance at an upper portion of the gate electrode GE2. Thus, the $i^{th}$ thin film transistor T1*i* and the $i^{th}$ pre-charging transistor T21 are completed on the base substrate 111.

The $j^{th}$ data line DLj, the first, second, and third storage lines SL1, SL2, and SL3, the $i^{th}$ thin film transistor T1*i*, and the $i^{th}$ pre-charging transistor T21, which are arranged on the gate insulating layer 112, are covered by a protective layer 113. The protective layer 113 is provided with a first contact hole C1 and a second contact hole C2 formed therethrough to expose the drain electrode DE1 of the $i^{th}$ thin film transistor T1*i* and the drain electrode DE2 of the $i^{th}$ pre-charging transistor T21, respectively.

The $i^{th}$ pixel electrode PEi is formed on the protective layer 113. The $i^{th}$ pixel electrode PEi includes a transparent conductive material. Also, the $i^{th}$ pixel electrode PEi is connected to the drain electrode DE1 of the $i^{th}$ thin film transistor T1*i* through the first contact hole C1 and is connected to the drain electrode DE2 of the $i^{th}$ pre-charging transistor T21 through the second contact hole C2.

According to the above, the $i^{th}$ pre-charging transistor T21 is connected between the previous gate line GLi−1 and the first storage line SL1 to pre-charge the $i^{th}$ pixel electrode PEi to the common voltage Vcom in response to the previous gate pulse.

As an example of the present exemplary embodiment, in the pixel having the horizontal pixel structure, the first, second, and third storage lines SL1, SL2, and SL3 are formed from the same layer with the $j^{th}$ data line DLj. Thus, the source electrode SE2 of the $i^{th}$ pre-charging transistor T21 may be branched from one of the first, second, and third storage lines SL1, SL2, and SL3. Therefore, the process to form the $i^{th}$ pre-charging transistor T21 on the array substrate 110 may be simplified.

Figure 6:
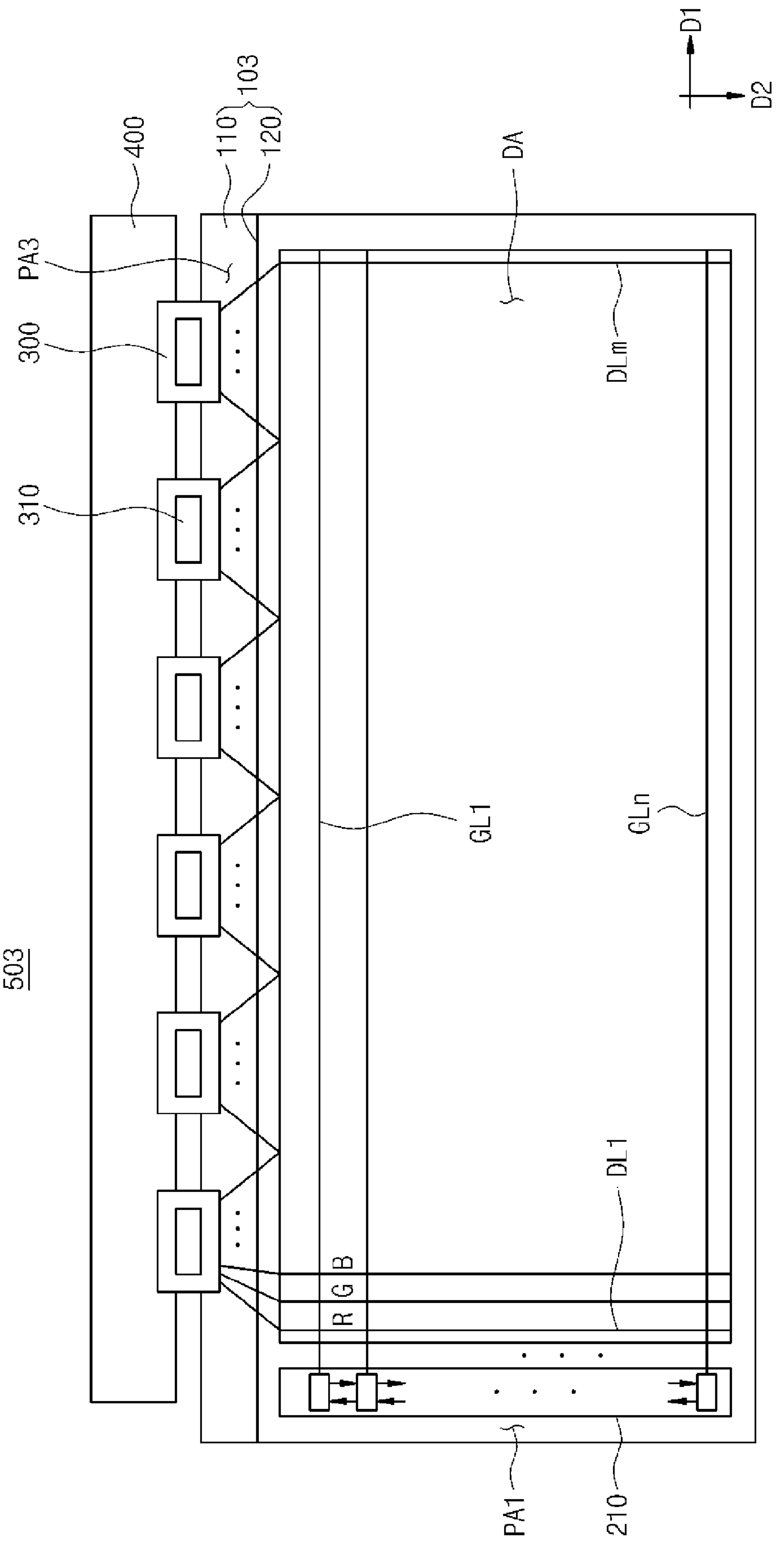
FIG. 6 is a plan view showing a liquid crystal display according to another exemplary embodiment of the present invention.
Figure 7:
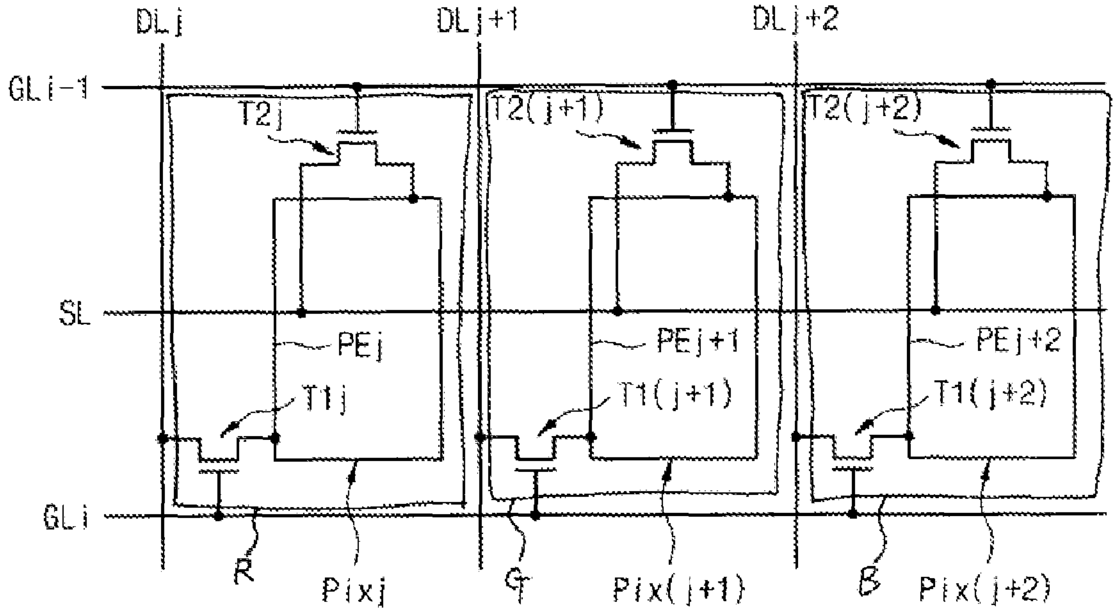
FIG. 7 is a circuit diagram showing one pixel having a vertical pixel structure shown in FIG. 6.

FIG. 6 is a plan view showing a liquid crystal display according to another exemplary embodiment of the present invention, and FIG. 7 is a circuit diagram showing one pixel having a vertical pixel structure shown in FIG. 6. In FIG. 6, the same reference numerals denote the same elements in FIG. 1, and thus, detailed descriptions of the same elements will be omitted.

Referring to FIG. 6, a liquid crystal display 503 includes a liquid crystal display panel 103 to display an image, a printed circuit board 400 arranged adjacent to the liquid crystal display panel 103, and a tape carrier package (TCP) 300 connecting the liquid crystal display panel 103 and the printed circuit board 400.

The liquid crystal display panel 103 includes an array substrate 110, a color filter substrate 120 facing the array substrate 110, and a liquid crystal layer (not shown) interposed between the array substrate 110 and the color filter substrate 120. The array substrate 110 is divided into a display area DA on which the image is displayed and a first peripheral area PA1 and a third peripheral area PA3 that are adjacent to the display area DA.

In the display area DA of the array substrate 110, a plurality of pixel areas is defined in a matrix configuration. The first peripheral area PA1 is adjacent to the first end of the gate lines GL1~GLn, and a gate driving circuit 210 is arranged in the first peripheral area PA1 to sequentially apply a gate pulse to the gate lines GL1~GLn. The gate driving circuit 210 includes a shift register having a plurality of stages connected to each other one after another. Each stage includes an output terminal connected to a corresponding first end of a gate line GL1~GLn. Thus, each stage is sequentially turned on to sequentially apply the gate pulse to the corresponding gate line of the gate lines GL1~GLn.

The third peripheral area PA3 is adjacent to one end of the data lines DL1~DLm, and a first end of the TCP 300 is attached to the third peripheral area PA3. A second end opposite to the first end of the TCP 300 is attached to the printed circuit board 400. A data driving chip 310 that provides a pixel voltage to the data lines DL1~DLm is mounted on the TCP 300.

As shown in FIG. 6, each pixel arranged on the array substrate 110 has a vertical pixel structure in which the length in the second direction D2 is longer than a length in the first direction D1. In the vertical pixel structure, three consecutive pixels arranged along the first direction D1 corresponding to red R, green G, and blue B pixels are defined as one pixel on which one color information is displayed.

Thus, in a liquid crystal display 503 employing the vertical pixel structure, the number of data lines is increased and the number of gate lines is decreased when compared to the horizontal pixel structure shown in FIG. 1.

Referring to FIG. 7, one pixel includes a first pixel Pixj corresponding to the red pixel R, a second pixel Pix(j+1) corresponding to the green pixel G, and a third pixel Pix(j+2) corresponding to the blue pixel B. Each of the first, second, and third pixels has the vertical pixel structure.

The first pixel Pixj includes an $i^{th}$ gate line GLi, a $j^{th}$ data line DLj, a storage line SL, a $j^{th}$ thin film transistor T1*j*, a $j^{th}$ precharging transistor T2*j*, and a $j^{th}$ pixel electrode PEj.

The $j^{th}$ thin film transistor T1*j* is connected to the $i^{th}$ gate line GLi and the $j^{th}$ data line DLj. Particularly, the $j^{th}$ thin film transistor T1*j* includes a gate electrode connected to the $i^{th}$ gate line GLi, a source electrode connected to the $j^{th}$ data line DLj, and a drain electrode connected to the $j^{th}$ pixel electrode PEj.

The $j^{th}$ pre-charging transistor T2*j* is connected to the $(-1)^{th}$ gate line GLi−1 and the storage line SL. Particularly, the $j^{th}$ pre-charging transistor T2*j* includes a gate electrode connected to the $(-1)^{th}$ gate line GLi−1, a source electrode connected to the storage line SL, and a drain electrode connected to the $j^{th}$ pixel electrode PEj.

The second pixel Pix(j+1) includes the $i^{th}$ gate line GLi, a $(j+1)^{th}$ data line DLj+1, the storage line SL, a $(j+1)^{th}$ thin film transistor T1(*j*+1), a $(j+1)^{th}$ pre-charging transistor T2(*j*+1), and a $(j+1)^{th}$ pixel electrode PEj+1.

The $(j+1)^{th}$ thin film transistor T1(*j*+1) is connected to the $i^{th}$ gate line GLi, the $(j+1)^{th}$ data line DLj+1, and the $(j+1)^{th}$ pixel electrode PEj+1. The $(j+1)^{th}$ pre-charging transistor T2(*j*+1) is connected to the $(i-1)^{th}$ gate line GLi−1, the storage line SL, and the $(j+1)^{th}$ pixel electrode PEj+1.

The third pixel Pix(j+2) includes the $i^{th}$ gate line GLi, a $(j+2)^{th}$ data line DLj+2, the storage line SL, a $(j_{+2})^{th}$ thin film transistor T1(*j*+2), a $(j+2)^{th}$ pre-charging transistor T2(*j*+2), and a $(j+2)^{th}$ pixel electrode PEj+2.

The $(j+2)^{th}$ thin film transistor T1(*j*+2) is connected to the $i^{th}$ gate line GLi, the $(j+2)^{th}$ data line DLj+2, and the $(j+2)^{th}$ pixel electrode PEj+2. The $(j+2)^{th}$ pre-charging transistor T2(*j*+2) is connected to the $(i-1)^{th}$ gate line GLi−1, the storage line SL, and the $(j+2)^{th}$ pixel electrode PEj+2.

The first, second, and third pixels Pixj, Pix(j+1), and Pix (j+2) pre-charge the $j^{th}$, the $(j+1)^{th}$, and the $(j+2)^{th}$ pixel electrodes PEj, PEj+1, and PEj+2 to a common voltage, respectively, in response to an $(i-1)^{th}$ gate pulse Gi−1 applied to the $(i-1)^{th}$ gate line GLi−1. Particularly, when the $j^{th}$, the $(j+1)^{th}$, and the $(j+2)^{th}$ precharging transistors T2*j*, T2(*j*+1), and T2(*j*+2) are turned on by the $(i-1)^{th}$ gate pulse Gi−1, the common voltage applied to the storage line SL is applied to the $j^{th}$, the $(j+1)^{th}$, and the $(j+2)^{th}$ pixel electrodes PEj, PEj+1, and PEj+2 through the $j^{th}$, the $(j+1)^{th}$, and the $(j+2)^{th}$ precharging transistors T2*j*, T2(*j*+1), and T2(*j*+2), respectively. Thus, the $j^{th}$, the $+1)^{th}$, and the $(j+2)^{th}$ pixel electrodes PEj, PEj+1, and PEj+2 are precharged to the common voltage during a 1H period (an $(i-1)^{th}$ active period) when the $(i-1)^{th}$ gate pulse Gi−1 is generated.

Then, the $j^{th}$, the $(j+1)^{th}$, and the $(j+2)^{th}$ thin film transistors T1*j*, T1(*j*+1), and T1(*j*+2) are turned on during an $i^{th}$ active period in response to the $i^{th}$ gate pulse Gi in order to apply the $j^{th}$, the $(j+1)^{th}$, and the $(j+2)^{th}$ pixel voltages applied through the $j^{th}$, $(j+1)^{th}$, and $(j+2)^{th}$ data lines DLj, DLj+1, and DLj+2 to the $j^{th}$, the $(j+1)^{th}$, and the $(j+2)^{th}$ pixel electrodes PEj, PEj+1, and PEj+2, respectively.

As described above, a present pixel electrode is pre-charged to the common voltage during a previous active period, so that the time required for a pixel voltage to reach a target voltage may be shortened during a present active period. Especially, when a polarity of the pixel voltage applied to each pixel is inverted at every frame, the present pixels are pre-charged to the common voltage that is a reference voltage of a polarity, and then receives a target pixel voltage in response to a present gate pulse. Thus, the time required for the pixel voltage to reach the target voltage may be shortened during the active period, so that the response speed of the liquid crystal may be improved.

Figure 8:
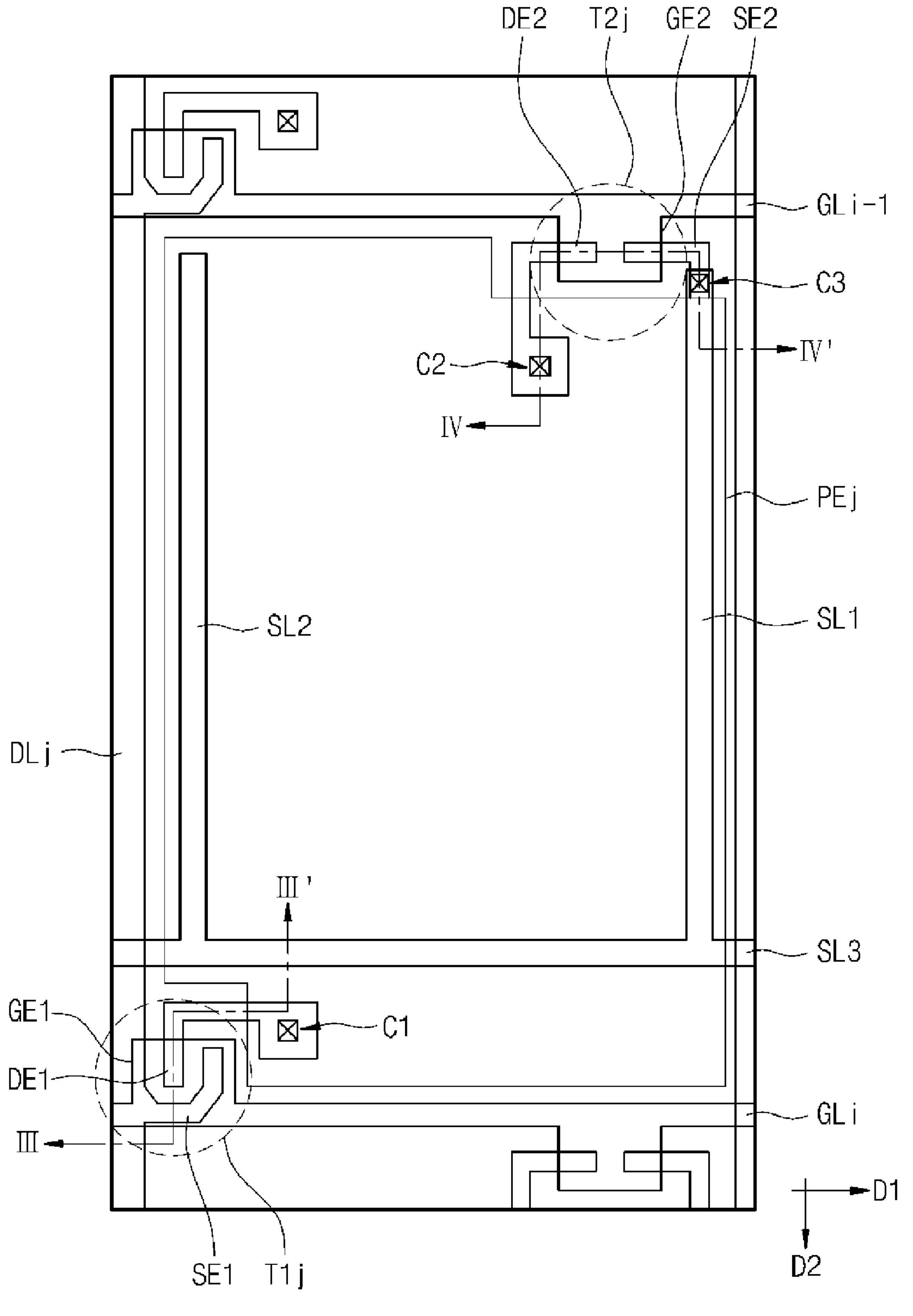
FIG. 8 is a layout showing a pixel on an array substrate shown in FIG. 6.
Figure 9:
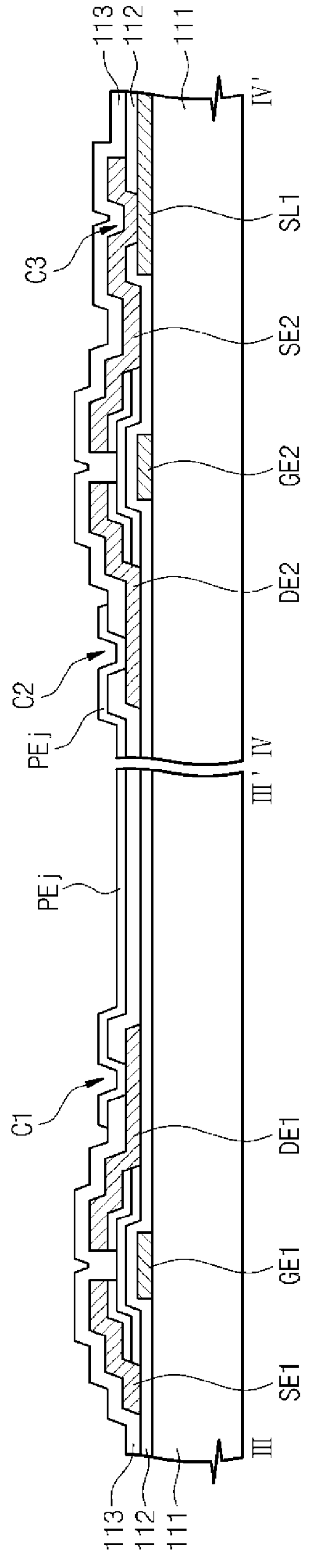
FIG. 9 is a sectional view taken along lines III-III' and IV-IV' shown in FIG. 8.

FIG. 8 is a layout showing a pixel on the array substrate shown in FIG. 6, and FIG. 9 is a sectional view taken along lines III-III' and IV-IV' shown in FIG. 8.

The array substrate 110 includes a base substrate 111 and a plurality of pixels arranged on the base substrate 111. Since each pixel has the same configuration, only one pixel (e.g. the $(ixj)^{th}$ pixel) will be described in detail with reference to FIG. 8 and FIG. 9.

Referring to FIG. 8 and FIG. 9, the $(i-1)^{th}$ gate line GLi−1, the $i^{th}$ gate line GLi, a first storage line SL1, a second storage line SL2, and a third storage line SL3 are formed on the base substrate 111. The $i^{th}$ gate line GLi is defined as a present gate line and the $(i-1)^{th}$ gate line is defined as a previous gate line with reference to the $(ixj)^{th}$ pixel. The $(i-1)^{th}$ gate line GLi−1 and the $i^{th}$ gate line GLi extend in the first direction D1. The first storage line SL1 and the second storage line SL2 extend in the second direction D2 parallel to each other and are arranged between the $(i-1)^{th}$ gate line GLi−1 and the $i^{th}$ gate line GLi. The third storage line SL3 extends in the first direction D1 and connects the first storage line SL1 and the second storage line SL2.

A gate electrode GE1 of a $j^{th}$ thin film transistor T1*j* and a gate electrode GE2 of a $ji^{th}$ pre-charging transistor T2*j* are formed on the base substrate 111. Particularly, the gate electrode GE1 of the $j^{th}$ thin film transistor T1*j* is branched from the $i^{th}$ gate line GLi and the gate electrode GE2 of the $j^{th}$ pre-charging transistor T2*j* is branched from the $(i-1)^{th}$ gate line GLi−1.

The $(i-1)^{th}$ gate line GLi−1, the $i^{th}$ gate line GLi, the first, second, and third storage lines SL1, SL2, and SL3, the gate electrode GE1 of the $j^{th}$ thin film transistor T1*j*, and the gate electrode GE2 of the $j^{th}$ pre-charging transistor T2*j*, which are arranged on the base substrate 111, are covered by a gate insulating layer 112. The gate insulating layer 112 is provided with a third contact hole C3 formed therethrough in order to expose one end of the first storage line SL1.

Then, the $j^{th}$ data line DLj extending in the second direction D2 is arranged on the gate insulating layer 112. Also, a source electrode SE1 and a drain electrode DEL of the $j^{th}$ thin film transistor T1*j* and a source electrode SE2 and a drain electrode DE2 of the $j^{th}$ pre-charging transistor T2*j* are formed on the gate insulating layer 112. The source electrode SE1 of the $j^{th}$ thin film transistor T1*j* is branched from the $j^{th}$ data line DLj, and the drain electrode DEL of the $j^{th}$ thin film transistor T1*j* is spaced apart from the source electrode SE1 by a predetermined distance at an upper portion of the gate electrode GE1.

The source electrode SE2 of the $j^{th}$ pre-charging transistor T2*j* is connected to the first storage line SL1, and the drain electrode DE2 of the $j^{th}$ pre-charging transistor T2*j* is spaced apart from the source electrode SE2 by a predetermined distance at an upper portion of the gate electrode GE2. The source electrode SE2 of the $j^{th}$ pre-charging transistor T2*j* is connected to the first storage line SL1 through the third contact hole C3 formed through the gate insulating layer 112. Thus, the $j^{th}$ thin film transistor T1*j* and the $j^{th}$ pre-charging transistor T2*j* are completed on the base substrate 111.

The $j^{th}$ data line DLj, the $j^{th}$ thin film transistor T1*j*, and the $j^{th}$ pre-charging transistor T2*j* arranged on the gate insulating layer 112 are covered by a protective layer 113. The protective layer 113 is provided with a first contact hole C1 and a second contact hole C2 through which the drain electrode DE1 of the $j^{th}$ thin film transistor T1*j* and the drain electrode DE2 of the $j^{th}$ pre-charging transistor T2*j* are exposed, respectively.

The $j^{th}$ pixel electrode PEj is formed on the protective layer 113, and the $j^{th}$ pixel electrode PEj is connected to the drain electrode DE1 of the $j^{th}$ thin film transistor T1*j* through the first contact hole C1 and the drain electrode DE2 of the $j^{th}$ pre-charging transistor T2*j* through the second contact hole C2.

As described above, the $j^{th}$ pre-charging transistor T2*j* is connected between the previous gate line GLi−1 and the first storage line SL1 to pre-charge the $j^{th}$ pixel electrode PEj to the common voltage in response to the previous gate pulse.

In FIG. 8 and FIG. 9, a structure in which the first, second, and third storage lines SL1, SL2, and SL3 are formed from the same layer as the $i^{th}$ gate line GLi in a pixel having the vertical pixel structure has been described. However, in the pixel having the vertical pixel structure, the first, second, and third storage lines SL1, SL2, and SL3 may be formed from the same layer with the $j^{th}$ data line DLj.

Figure 10:
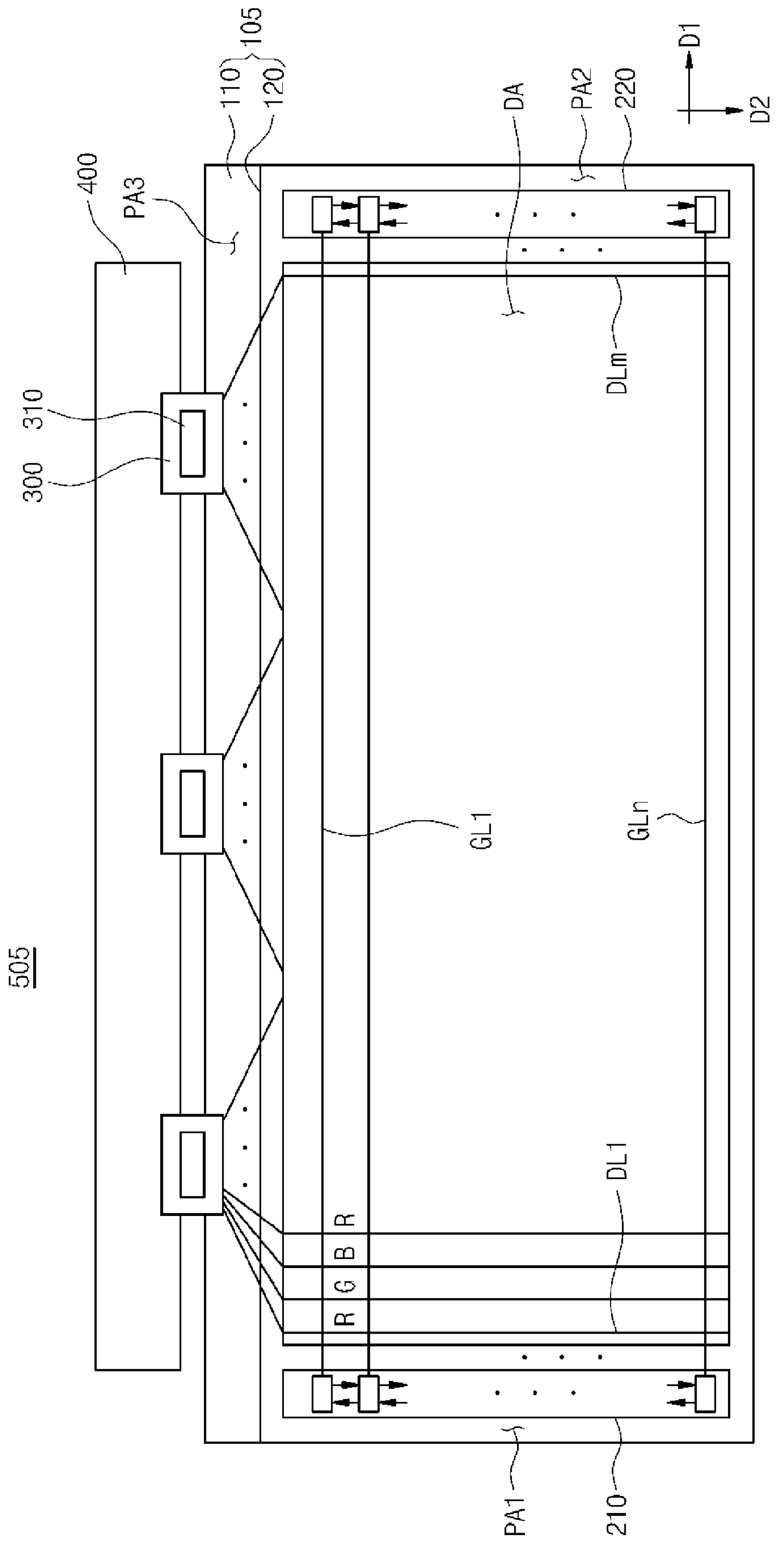
FIG. 10 is a plan view showing a liquid crystal display according to another exemplary embodiment of the present invention.

FIG. 10 is a plan view showing a liquid crystal display according to another exemplary embodiment of the present invention. In FIG. 10, the same reference numerals denote the same elements in FIG. 6, and thus, detailed descriptions of the same elements will be omitted.

Referring to FIG. 10, a liquid crystal display 505 includes an array substrate 110 that is divided into a display area DA on which the image is displayed, a first peripheral area PA1, a second peripheral area PA2, and a third peripheral area PA3. The peripheral areas PA1, PA2, and PA3 are adjacent to the display area DA.

In the display area DA of the array substrate 110, a plurality of pixel areas is defined in a matrix configuration. The first peripheral area PA1 is adjacent to the first end of the gate lines GL1~GLn, and a first gate driving circuit 210 is arranged in the first peripheral area PA1 to sequentially apply a gate pulse to the gate lines GL1~GLn. The second peripheral area PA2 is adjacent to the second end of the gate lines GL1~GLn, and a second gate driving circuit 220 is arranged in the second peripheral area PA2 to sequentially apply the gate pulse to the gate lines GL1~GLn.

The third peripheral area PA3 is adjacent to one end of the data lines DL1~DLm, and a TCP 300 is attached to the third peripheral area PA3. A data driving chip 310 that provides a pixel voltage to the data lines DL1~DLm is mounted on the TCP 300.

As shown in FIG. 10, each pixel arranged on the array substrate 110 has a vertical pixel structure of which a length in the second direction D2 is longer than a length in the first direction D1. In the vertical pixel structure, three consecutive pixels arranged along the first direction D1 corresponding to red R, green G, and blue B pixels are defined as one pixel in which one color is displayed.

In FIG. 10, one data line is connected to two pixels that are arranged on the left and right sides thereof. Thus, in the liquid crystal display 505 shown in FIG. 10, the number of data lines is decreased by half and the number of gate lines is increased by two times when compared to the liquid crystal display 503 shown in FIG. 6.

Figure 11:
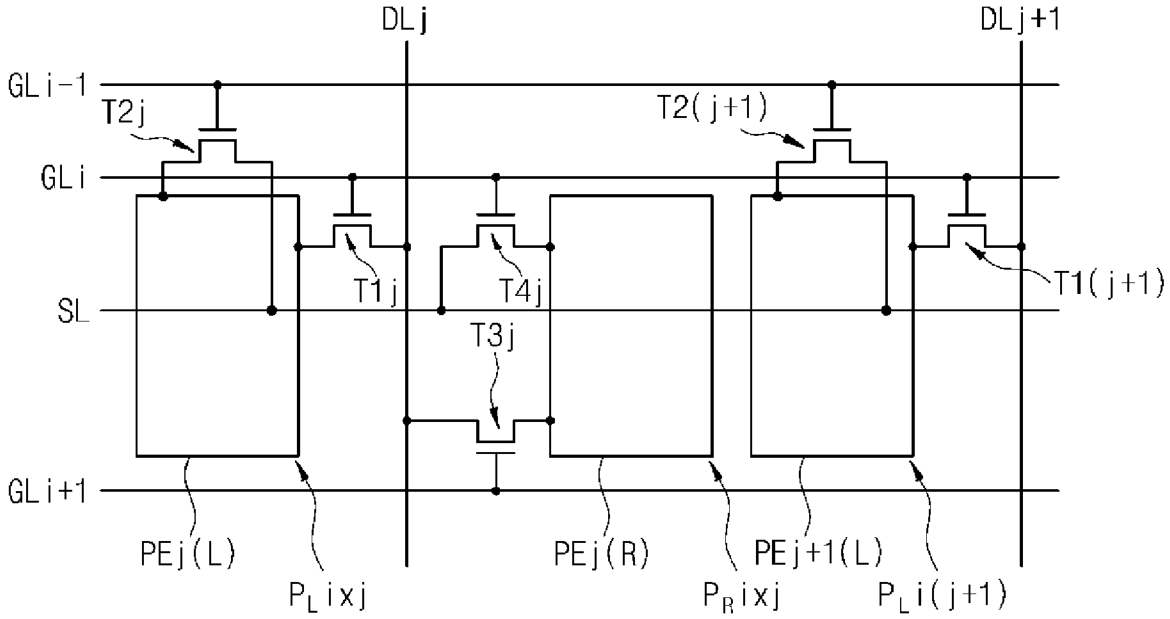
FIG. 11 is a circuit diagram showing one pixel having a vertical pixel structure shown in FIG. 10.
Figure 12:
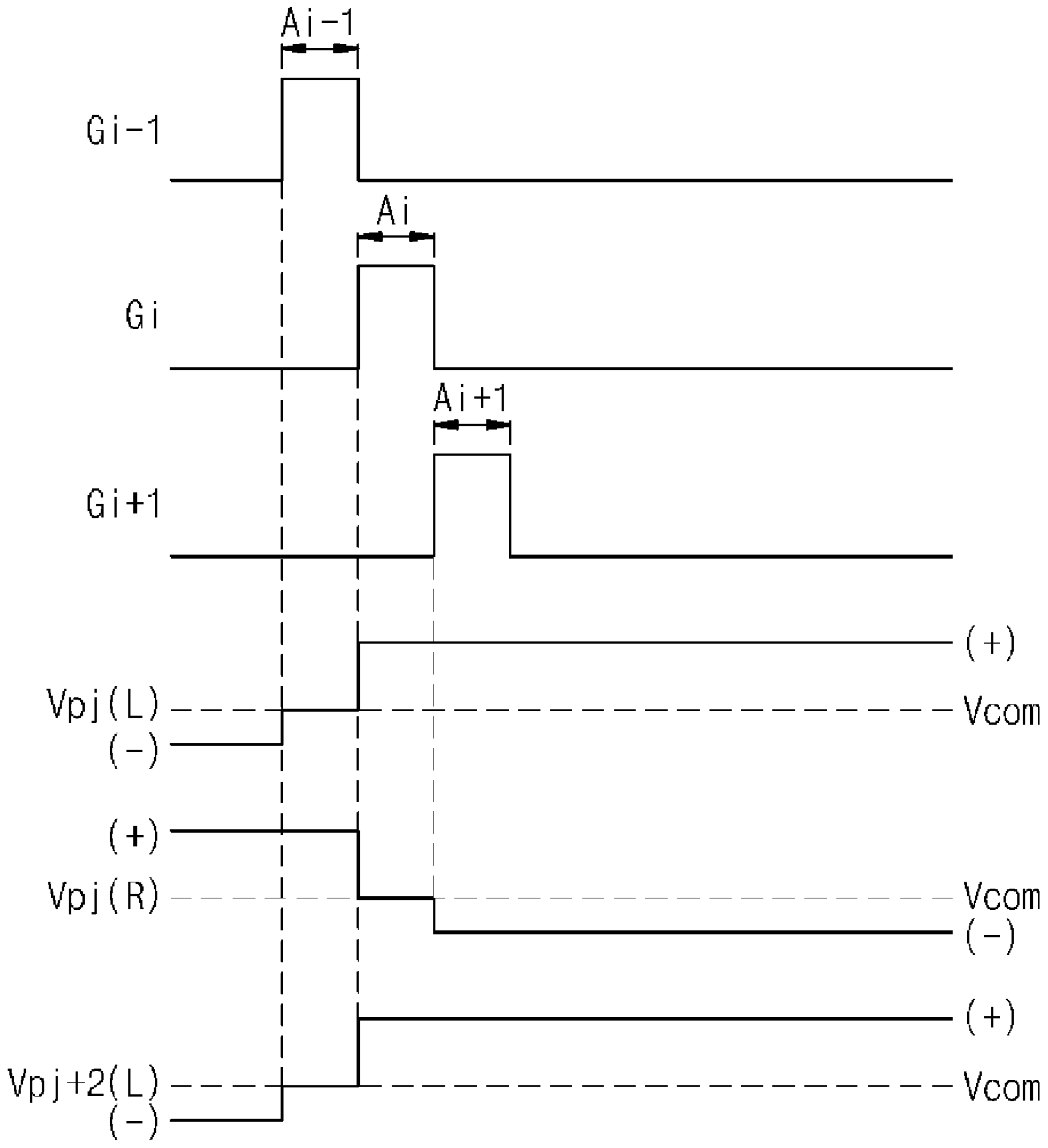
FIG. 12 is a waveform diagram showing a variation of a pixel voltage according to a gate pulse in one pixel of FIG. 11.

FIG. 11 is a circuit diagram showing one pixel having the vertical pixel structure shown in FIG. 10, and FIG. 12 is a waveform diagram showing a variation of a pixel voltage according to a gate pulse in one pixel shown in FIG. 11.

Referring to FIG. 11, one pixel includes a first pixel $P_L$ixj corresponding to a red pixel R, a second pixel $P_R$ixj corresponding to a green pixel G, and a third pixel $P_L$ix(j+1) corresponding to a blue pixel B. Each of the first, second, and third pixels $P_L$ixj, $P_R$ixj, and $P_L$ix(j+1) has a vertical pixel structure.

The first pixel $P_L$ixj includes an $i^{th}$ gate line GLi, a $j^{th}$ data line DLj, a storage line SL, a $j^{th}$ left thin film transistor T1*j*, a $j^{th}$ left pre-charging transistor T2*j*, and a $j^{th}$ left pixel electrode PEj(L).

The $j^{th}$ left thin film transistor T1*j* is connected to the $i^{th}$ gate line GLi and the $j^{th}$ data line DLj. Particularly, the $j^{th}$ left thin film transistor T1*j* includes a gate electrode connected to the $i^{th}$ gate line GLi, a source electrode connected to the $j^{th}$ data line DLj and a drain electrode connected to the $j^{th}$ left pixel electrode PEj(L).

The $j^{th}$ left pre-charging transistor T2*j* is connected to the $(i-1)^{th}$ gate line GLi−1 and the storage line SL. Particularly, the $j^{th}$ left pre-charging transistor T2*j* includes a gate electrode connected to the $(-1)^{th}$ gate line GLi−1, a source electrode connected to the storage line SL, and a drain electrode connected to the $j^{th}$ left pixel electrode PEj(L).

The second pixel $P_R$ixj includes an $(i+1)^{th}$ gate line GLi+1, the $j^{th}$ data line DLj, the storage line SL, a $j^{th}$ right thin film transistor T3*j*, a $j^{th}$ right pre-charging transistor T4*j*, and a $j^{th}$ right pixel electrode PEj(R).

The $j^{th}$ right thin film transistor T3*j* is connected to the $(i+1)^{th}$ gate line GLi+1, the $j^{th}$ data line DLj, and the $j^{th}$ right pixel electrode PEj(R). The $j^{th}$ right pre-charging transistor T4*j* is connected to the $i^{th}$ gate line GLi, the storage line SL, and the j $j^{th}$ right pixel electrode PEj(R).

The third pixel includes the $i^{th}$ gate line GLi, an $(j+1)^{th}$ data line DLj+1, the storage line SL, a $(j+1)^{th}$ left thin film transistor T1(*j*+1), a $(j+1)^{th}$ left pre-charging transistor T2(*j*+1), and a $(j+1)^{th}$ left pixel electrode PEj+1(L).

The $(j+1)^{th}$ left thin film transistor T1(*j*+1) is connected to the $i^{th}$ gate line GLi, the $(j+1)^{th}$ data line DLj+1, and the $(j+1)^{th}$ left pixel electrode PEj+1(L). The $(j+1)^{th}$ left pre-charging transistor T2(*j*+1) is connected to the $(i-1)^{th}$ gate line GLi−1, the storage line SL, and the $(j+1)^{th}$ left pixel electrode PEj+1(L).

As shown in FIG. 11 and FIG. 12, the first and third pixels $P_L$ixj and $P_L$ix(j+1) pre-charge the $j^{th}$ left pixel electrode PEj(L) and the $(j+1)^{th}$ left pixel electrode PEj+1(L) to the common voltage Vcom in response to an $(-1)^{th}$ gate pulse Gi−1 applied to the $(-1)^{th}$ gate line GLi−1. Particularly, when the $j^{th}$ left pre-charging transistor T2*j* and the $(j+1)^{th}$ left pre-charging transistor T2(*j*+1) are turned on in response to the $(i-1)^{th}$ gate pulse Gi−1, the common voltage Vcom applied to the storage line SL is applied to the $j^{th}$ left pixel electrode PEj(L) and the $(j+1)^{th}$ left pixel electrode PEj+1(L) through the $j^{th}$ left pre-charging transistor T2*j* and the $(j+1)^{th}$ left pre-charging transistor T2(*j*+1), respectively. Thus, the $j^{th}$ left pixel electrode PEj(L) and the $(j+1)^{th}$ left pixel electrode PEj+1(L) are pre-charged to the common voltage Vcom during the 1H period (an $(i-1)^{th}$ active period Ai−1) when the $(-1)^{th}$ gate pulse Gi−1 is generated.

Then, the $j^{th}$ left thin film transistor T1*j* and the $(j+1)^{th}$ left thin film transistor T1(*j*+1) are turned on in response to an $i^{th}$ gate pulse Gi during an $i^{th}$ active period Ai to apply a $j^{th}$ left pixel voltage Vpj(L) and a $(j+1)^{th}$ left pixel voltage Vpj+1(L), which are applied through the $j^{th}$ data line DLj and the $(j+1)^{th}$ data line DLj+1, to the $j^{th}$ left pixel electrode PEj(L) and the $(j+1)^{th}$ left pixel electrode PEj+1(L), respectively.

Also, the $j^{th}$ right pre-charging transistor T4*j* is turned on in response to the $i^{th}$ gate pulse Gi during the $i^{th}$ active period Ai, so that the common voltage Vcom is pre-charged in the $j^{th}$ right pixel electrode PEj(R). Then, when the $j^{th}$ right thin film transistor T3*j* is turned on in response to the $(i+1)^{th}$ gate pulse Gi+1, a $j^{th}$ right pixel voltage Vpj(R) is applied through the $j^{th}$ data line DLj to the $j^{th}$ right pixel electrode PEj(R) during an $(i+1)^{th}$ active period Ai+1.

As a result, when a time during which pixels connected to one row are turned on is defined as a 1H period, even-numbered pixels among the pixels connected to one row are turned on in response to the $i^{th}$ gate pulse Gi generated during an earlier H/2 period, and odd-numbered pixels are turned on in response to the $(i-1)^{th}$ gate pulse Gi−1 during a later H/2 period. Also, the even-numbered pixels are pre-charged to the common voltage Vcom in response to the $(i-1)^{th}$ gate pulse Gi−1, and the odd-numbered pixels are pre-charged to the common voltage Vcom in response to the $i^{th}$ gate pulse Gi.

As described above, the time required for the pixel voltage to reach the target voltage may be shortened during the present active period since the present pixel electrode is pre-charged to the common voltage during the previous active period. Particularly, when the polarity of the pixel voltage applied to each pixel is inverted at every frame, present pixels are pre-charged to the common voltage, which is a reference voltage of polarity, and then receive the target pixel voltage. Thus, the time required for the pixel voltage to reach the target voltage may be shortened during the active period, thereby improving the response speed of the liquid crystal.

In FIG. 1, FIG. 2, FIG. 3, FIG. 4, FIG. 5, FIG. 6, FIG. 7, FIG. 8, FIG. 9, FIG. 10, FIG. 11, and FIG. 12, only structures in which the gate driving circuit is directly formed on an array substrate 110 have been described. However, the gate driving circuit may be prepared in the form of a chip to be mounted on the array substrate 110 in a chip-on-glass method or on the TCP.

Although not shown in figures, the method of the present invention in which the pixel electrode is pre-charged to the common voltage may be employed in liquid crystal displays with a wide viewing angle characteristics, for example, Patterned Vertical Alignment mode liquid crystal displays, Multi-domain Vertical Alignment mode liquid crystal displays, Super-Patterned Vertical Alignment (S-PVA) mode liquid crystal displays, etc.

Particularly, the S-PVA mode liquid crystal display includes a pixel having main and sub pixels to which different sub voltages are applied in order to form a domain having different gray-scales in the pixel. Since human eyes looking at the liquid crystal display only recognize an intermediate value between the two sub voltages, a deterioration of a lateral viewing angle due to a distorted gamma curve below an intermediate gray-scale may be prevented, thereby improving the lateral visibility of the liquid crystal display.

The above S-PVA mode liquid crystal display is classified into a coupling capacitor (CC) type and a two transistor (TT) type according to a driving method thereof. In the CC-type S-PVA mode liquid crystal display, a coupling capacitor is added between a main pixel electrode and a sub pixel electrode to drop a data voltage applied to the sub pixel electrode, so that a pixel voltage that is lower than the main pixel voltage is applied as a sub pixel voltage. Meanwhile, in the TT-type S-PVA mode liquid crystal display, a main pixel voltage and a sub pixel voltage having different voltage levels are applied to a main pixel electrode and a sub pixel electrode, respectively, using two transistors that are turned on for a predetermined time interval. Thus, in case of the TT-type driving method, the time needed to charge the main and sub pixel voltages may be decreased by the H/2 period in comparison with the CC-type driving method.

Accordingly, in the S-PVA mode liquid crystal display employing the TT-type driving method, a charge rate of the liquid crystal in main and sub pixel areas may be improved since the main and sub pixel electrodes are pre-charged to the common voltage, thereby improving the response speed of the S-PVA liquid crystal display.

According to the above, the present pixel electrode is pre-charged to the common voltage that is the reference pixel voltage in response to the previous gate pulse during the previous 1H period, and the pixel voltage is applied to the present pixel in response to the present gate pulse during the present 1H period.

Thus, the time required for the pixel voltage of each pixel to reach the target voltage during the active period, in which present pixels connected to one row are operated, may be shortened, thereby improving the response speed of the liquid crystal.

Also, in conventional methods in which the present pixel is pre-charged to the previous pixel voltage, a ghost phenomenon where an image having a higher gray-scale than a desired gray-scale is displayed due to an overcharged present pixel may occur. However, according to exemplary embodiments of the present invention, the present pixel is pre-charged to the common voltage, which is used as the reference voltage of the pixel voltage. Thus, the ghost phenomenon may be prevented, thereby improving the display quality of the display apparatus.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate comprising:
a base substrate; and
a plurality of pixels arranged on the base substrate,
each pixel comprising:
a gate line;
a storage line to receive a common voltage;
a data line to receive a pixel voltage, the data line being insulated from the gate line and crossing the gate line, wherein the pixel voltage has either a positive polarity or a negative polarity with respect to the common voltage, and the polarity of the pixel voltage is inverted every frame;
a thin film transistor connected to the gate line and the data line;
a pixel electrode connected to the thin film transistor; and
a pre-charging transistor comprising a first electrode connected to a previous gate line, a second electrode connected to the storage line, and a third electrode connected to the pixel electrode.

2. The array substrate of claim 1, wherein the storage line is formed from the same layer as the gate line.

3. The array substrate of claim 1, wherein the storage line is extended from and integrally formed with the second electrode of the pre-charging transistor.

4. The array substrate of claim 3, wherein the first electrode of the pre-charging transistor:
is branched from the previous gate line.

5. The array substrate of claim 1, wherein each pixel has a horizontal pixel structure in which a length of the pixel in a direction in which the gate line extends is longer than a length of the pixel in a direction in which the data line extends.

6. The array substrate of claim 5, wherein the storage line comprises:
a first storage line arranged adjacent to a previous gate line, the first storage line being substantially parallel to the previous gate line and overlapping the pixel electrode;
a second storage line arranged adjacent to the gate line, the second storage line being substantially parallel to the gate line and overlapping the pixel electrode; and
a third storage line substantially parallel to the data line, the third storage line connecting the first storage line and the second storage line and overlapping the pixel electrode.

7. The array substrate of claim 1, wherein each pixel has a vertical pixel structure in which a length of the pixel in a direction in which the data line extends is longer than a length of the pixel in a direction in which the gate line extends.

8. The array substrate of claim 7, wherein the storage line comprises:
a first storage line and a second storage line spaced apart from each other, substantially parallel to the data line, and overlapping the pixel electrode; and
a third storage line substantially parallel to the gate line, the third storage line connecting the first storage line and the second storage line and overlapping the pixel electrode.

9. A display apparatus, comprising:
a display panel comprising an array substrate comprising a base substrate and a plurality of pixels arranged on the base substrate and an opposite substrate coupled to the array substrate and facing the array substrate;
a gate driving circuit connected to the display panel; and
a data driving circuit connected to the display panel,
each pixel comprising:
a gate line;
a storage line to receive a common voltage;
a data line to receive the pixel voltage, the data line being insulated from the gate line and crossing the gate line, wherein the pixel voltage has either a positive polarity or a negative polarity with respect to the common voltage, and the polarity of the pixel voltage is inverted every frame;
a thin film transistor connected to the gate line and the data line;
a pixel electrode connected to the thin film transistor; and
a pre-charging transistor comprising a first electrode connected to a previous gate line, a second electrode connected to the storage line, and a third electrode connected to the pixel electrode.

10. The display apparatus of claim 9, wherein the gate driving circuit is directly formed on the array substrate through a thin film process that forms the pixels on the array substrate.

11. The display apparatus of claim 10, wherein the gate driving circuit comprises:
a first gate driving circuit connected to a first end of the gate line; and
a second gate driving circuit connected to a second end of the gate line.

12. The display apparatus of claim 11, wherein the array substrate comprises a display area in which the pixels are arranged to display an image, a first peripheral area adjacent to the first end of the gate line, and a second peripheral area adjacent to the second end of the gate line, and the first gate driving circuit and the second gate driving circuit are arranged in the first peripheral area and the second peripheral area, respectively.

13. The display apparatus of claim 11, wherein each pixel has a horizontal pixel structure in which a length of the pixel in a direction in which the gate line extends is longer than a length of the pixel in a direction in which the data line extends.

14. The display apparatus of claim 13, wherein the display panel further comprises red, green, and blue color pixels corresponding to three consecutive pixels arranged along the direction in which the data line extends, respectively, and the three pixels serve as one unit pixel to display a color information.

15. The display apparatus of claim 11, wherein each pixel has a vertical pixel structure in which a length of the pixel in a direction in which the data line extends is longer than a length of the pixel in a direction in which the gate line extends.

16. The display apparatus of claim 15, wherein the display panel further comprises red, green, and blue color pixels corresponding to three consecutive pixels arranged along the direction in which the gate line extends, respectively, and the three pixels serve as one unit pixel to display a color information.

17. The display apparatus of claim 16, wherein the gate line receives a gate pulse from the gate driver during a present one horizontal scanning period (1H period), odd-numbered pixels among the pixels arranged in one row are turned on during an earlier H/2 period within the present 1H period, and even-numbered pixels among the pixels arranged in the one row are turned on during a later H/2 period within the present 1H period.

18. The display apparatus of claim 17, wherein the data line is to apply the pixel voltage to the odd-numbered pixels during the earlier H/2 period and to apply the pixel voltage to the even-numbered pixels during the later H/2 period.

19. The display apparatus of claim 17, wherein the gate line comprises:

a first gate line to turn on the odd-numbered pixels during the earlier H/2 period; and a second gate line to turn on the even-numbered pixels during the later H/2 period.

* * * * *